(12) United States Patent
Olson et al.

(10) Patent No.: US 11,193,198 B2
(45) Date of Patent: Dec. 7, 2021

(54) METHODS OF FORMING DEVICES ON A SUBSTRATE

(71) Applicant: Applied Materials, Inc., Santa Clara, CA (US)

(72) Inventors: Joseph C. Olson, Beverly, MA (US); Ludovic Godet, Sunnyvale, CA (US); Rutger Meyer Timmerman Thijssen, San Jose, CA (US); Morgan Evans, Manchester, MA (US); Jinxin Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/706,113

(22) Filed: Dec. 6, 2019

(65) Prior Publication Data

US 2020/0190658 A1 Jun. 18, 2020

Related U.S. Application Data

(60) Provisional application No. 62/780,792, filed on Dec. 17, 2018.

(51) Int. Cl.
| | |
|---|---|
| *G03F 7/20* | (2006.01) |
| *C23C 14/22* | (2006.01) |
| *G02B 5/18* | (2006.01) |
| *G03F 7/00* | (2006.01) |

(Continued)

(52) U.S. Cl.
CPC .......... *C23C 14/221* (2013.01); *G02B 5/1857* (2013.01); *G03F 7/001* (2013.01); *G03F 7/16* (2013.01); *G03F 7/2002* (2013.01); *G02B 6/0016* (2013.01); *G02B 6/0065* (2013.01)

(58) Field of Classification Search
CPC ... C23C 14/562; C23C 14/221; C23C 14/568; G02B 5/1857; G02B 6/0016; G02B 6/0065; G03F 7/001; G03F 7/16; G03F 7/2002; G03F 7/2032; G03F 7/24; G03F 7/2065

See application file for complete search history.

(56) References Cited

U.S. PATENT DOCUMENTS 4,240,448 A * 12/1980 Heitmann .............. A24C 5/606
131/280
5,589,263 A * 12/1996 Ueda ..................... G11B 5/65
428/336

(Continued)

OTHER PUBLICATIONS

International Search Report and Written Opinion for Application No. PCT/US2019/064966.

*Primary Examiner* — Wyatt A Stoffa
(74) *Attorney, Agent, or Firm* — Patterson + Sheridan, LLP

(57) ABSTRACT

Embodiments of the disclosure relate to systems and methods for forming devices on a substrate. For example, a method for forming devices on a substrate can include projecting one or more ion beams from one or more ion beam chambers to form one or more devices on a first surface of a substrate and projecting one or more ion beams from one or more ion beam chambers to form one or more devices on a second surface of a substrate. In these embodiments, the first surface and the second surface are on opposite sides of the substrate. Therefore, the ion beams can form the devices on both sides of the substrate.

15 Claims, 4 Drawing Sheets

(51) Int. Cl.
*G03F 7/16* (2006.01)
*F21V 8/00* (2006.01)

(56) References Cited

U.S. PATENT DOCUMENTS

| | | | | |
|---|---|---|---|---|
| 5,858,450 A | * | 1/1999 | Fujimura | G02B 1/10 |
| | | | | 427/9 |
| 6,176,932 B1 | * | 1/2001 | Watanabe | C23C 14/56 |
| | | | | 118/719 |
| 6,841,789 B2 | * | 1/2005 | Koh | H01J 37/3277 |
| | | | | 250/492.3 |
| 6,911,129 B1 | * | 6/2005 | Li | B01J 19/0046 |
| | | | | 118/504 |
| 8,324,086 B2 | * | 12/2012 | Shimomura | B23K 26/08 |
| | | | | 438/479 |
| 8,759,798 B2 | * | 6/2014 | Kim | H01L 21/67213 |
| | | | | 250/492.21 |
| 9,543,114 B2 | * | 1/2017 | Adibi | H01J 37/3045 |
| 10,001,699 B2 | * | 6/2018 | Orihara | G02B 5/0891 |
| 2002/0014597 A1 | | 2/2002 | Koh et al. | |
| 2004/0020761 A1 | * | 2/2004 | Thomsen | C03C 17/3644 |
| | | | | 204/192.12 |
| 2004/0058088 A1 | * | 3/2004 | Beag | C23C 14/022 |
| | | | | 427/525 |
| 2005/0166850 A1 | * | 8/2005 | Li | B01J 19/0046 |
| | | | | 118/730 |
| 2005/0230353 A1 | | 10/2005 | Danziger | |
| 2005/0271799 A1 | * | 12/2005 | Moriwaki | G11B 5/73937 |
| | | | | 427/127 |
| 2010/0044595 A1 | * | 2/2010 | Henley | B28D 5/0011 |
| | | | | 250/492.21 |
| 2010/0053577 A1 | * | 3/2010 | Lee | G03B 27/58 |
| | | | | 355/47 |
| 2010/0282413 A1 | * | 11/2010 | Nolan | C23C 14/568 |
| | | | | 156/345.24 |
| 2011/0065282 A1 | * | 3/2011 | Yan | H01L 51/0021 |
| | | | | 438/758 |
| 2011/0124186 A1 | * | 5/2011 | Renau | H01J 37/32357 |
| | | | | 438/513 |
| 2011/0165338 A1 | * | 7/2011 | Kitajima | H01L 23/49586 |
| | | | | 427/468 |
| 2011/0281029 A1 | * | 11/2011 | Honda | C23C 14/24 |
| | | | | 427/255.7 |
| 2012/0196430 A1 | | 8/2012 | Riordon et al. | |
| 2013/0001195 A1 | * | 1/2013 | Feldbaum | H01J 37/30 |
| | | | | 216/66 |
| 2013/0122316 A1 | * | 5/2013 | Brabbs | B05D 3/04 |
| | | | | 428/461 |
| 2015/0048047 A1 | * | 2/2015 | Liu | G03H 1/0244 |
| | | | | 216/24 |
| 2015/0079271 A1 | * | 3/2015 | Hermanns | C23C 16/4401 |
| | | | | 427/8 |
| 2015/0179986 A1 | * | 6/2015 | Yan | H01L 51/0021 |
| | | | | 438/46 |
| 2016/0329446 A1 | * | 11/2016 | Lim | H01L 31/0463 |
| 2019/0131044 A1 | * | 5/2019 | Deutscher | H01F 6/06 |
| 2020/0010947 A1 | * | 1/2020 | Poplavskyy | H01L 21/02568 |
| 2020/0335654 A1 | * | 10/2020 | Heckel | C23C 14/34 |

* cited by examiner

METHODS OF FORMING DEVICES ON A SUBSTRATE

CROSS-REFERENCE TO RELATED APPLICATIONS

This application claims priority to U.S. Provisional Patent Application Ser. No. 62/780,792, filed Dec. 17, 2018, which is hereby incorporated by reference in its entirety.

BACKGROUND

Field

Embodiments described in the present disclosure generally relate to methods and systems for forming devices on substrates.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences.

A virtual image is overlaid on an ambient environment to provide an augmented reality experience to the user. Waveguides are used to assist in overlaying images. Generated light is propagated through a waveguide until the light exits the waveguide and is overlaid on the ambient environment. Optical devices generally need multiple waveguides with different physical properties on the same substrate in order to guide light of different wavelengths.

One drawback in the art is that manufacturing waveguides on the same substrate is a time-consuming process. Different mask steps and methods are needed in photolithography in order to manufacture waveguides with different material properties. In addition, some photolithography methods do not have the capability to make varying spacing and profiles of devices in the different waveguides.

Therefore, what is needed is a manufacturing process that allows formation of devices on different portions of substrates.

SUMMARY

Embodiments of the disclosure generally relate to methods and systems for forming devices on substrates.

In one embodiment, a method for forming devices on a substrate includes projecting one or more ion beams from one or more ion beam chambers to form one or more devices on a first surface of a substrate; and projecting one or more ion beams from one or more ion beam chambers to form one or more devices on a second surface of a substrate, wherein the first surface and the second surface are on opposite sides of the substrate.

In another embodiment, a system for forming devices on a substrate includes one or more ion beam chambers positioned to project one or more ion beams, toward a first surface of a substrate; and one or more ion beam chambers positioned to project one or more ion beams toward a second surface of a substrate, wherein the first surface and the second surface are on opposite sides of the substrate.

In another embodiment, a computer readable medium having instructions thereon which, when executed by one or more processors, causes a system to: project one or more ion beams from one or more ion beam chambers to form one or more devices on a first surface of a substrate; and project one or more ion beams from one or more ion beam chambers to form one or more devices on a second surface of a substrate, wherein the first surface and the second surface are on opposite sides of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments of the disclosure relate to systems and methods for forming devices on a substrate. For example, a method for forming devices on a substrate can include projecting one or more ion beams from one or more ion beam chambers to form one or more devices on a first surface of a substrate and projecting one or more ion beams from one or more ion beam chambers to form one or more devices on a second surface of a substrate. In these embodiments, the first surface and the second surface are on opposite sides of the substrate. Therefore, the ion beams can form the devices on both sides of the substrate.

Figure 1A:
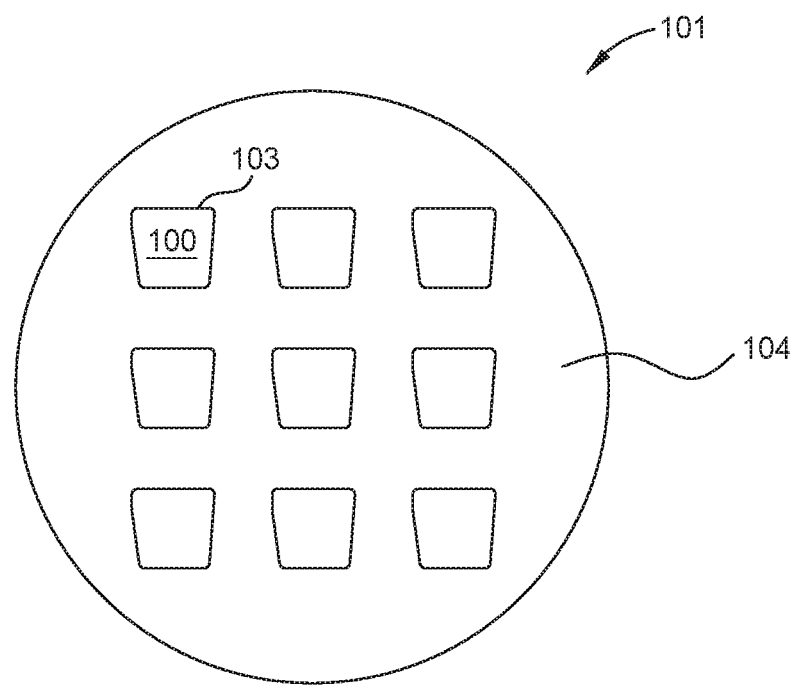
FIG. 1A is a perspective, frontal view of a substrate having a plurality of lenses disposed thereon according to at least one embodiment described herein.

FIG. 1A illustrates a perspective frontal view of a substrate 101, according to at least one embodiment. The substrate 101 is configured to be used in an optical device. The substrate 101 can be any substrate used in the art. For example, the substrate 101 includes a semiconducting material, e.g., silicon (Si), germanium (Ge), silicon germanium (SiGe), and/or a III-V semiconductor such as gallium arsenide (GaAs). In another example, the substrate 101 includes a transparent material, e.g., glass and/or plastic. The substrate 101 can have any number of insulating, semiconducting, or metallic layers thereon.

As shown, the substrate 101 includes a plurality of lenses 103 disposed on a surface 104. The plurality of lenses 103 are configured to focus light, depending on the use of the substrate 101. The plurality of lenses 103 are disposed on the substrate 101 in a grid of rows and columns. It is contemplated that other suitable arrangements of disposing the plurality of lenses 103 on the substrate 101 can be implemented according to the embodiments described herein. After methods of fabricating waveguide combiners described herein, each lens of the plurality of lenses 103 includes a waveguide combiner 100.

Figure 1B:
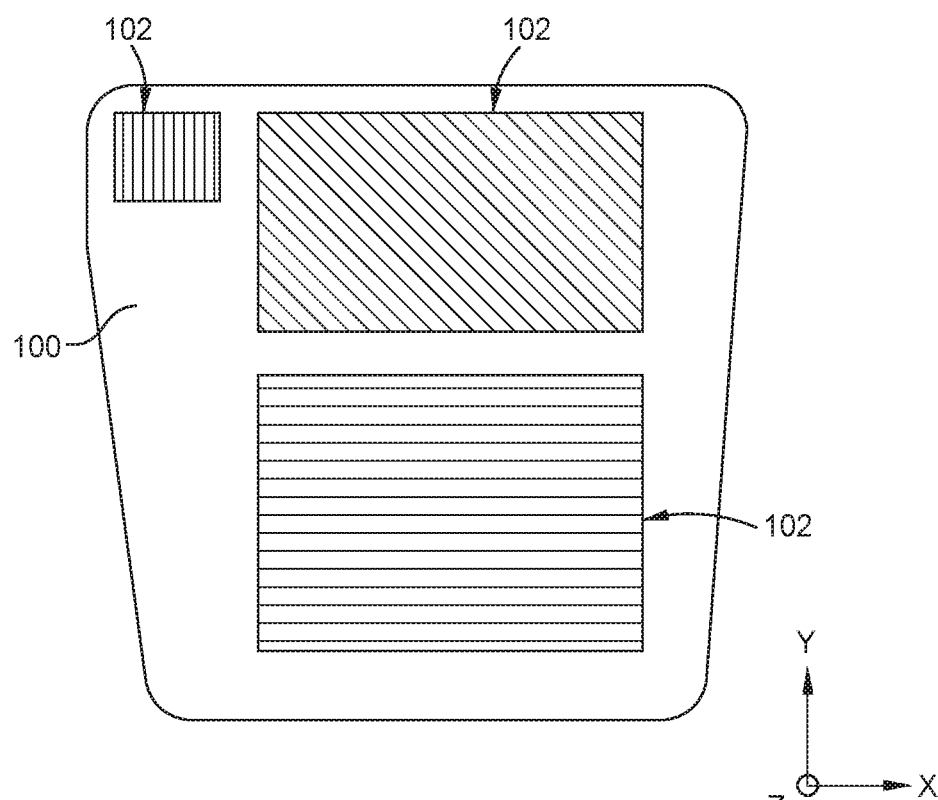
FIG. 1B is a perspective, frontal view of a waveguide combiner according to at least one embodiment described herein.

FIG. 1B illustrates a perspective frontal view of the waveguide combiner 100, according to one embodiment. The waveguide combiner 100 is configured to guide electromagnetic radiation (e.g., light). As shown, the waveguide combiner 100 includes a plurality of regions each including a plurality of gratings 102. The plurality of gratings 102 are configured to receive incident beams of light (a virtual image) having an intensity from a microdisplay. Each grating of the plurality of gratings 102 splits the incident beams into a plurality of modes, each beam having a mode. Zero-order mode ($T_0$) beams are refracted back or lost in the waveguide combiner 100. Positive first-order mode ($T_1$) beams undergo total internal-reflection (TIR) through the waveguide combiner 100 to the plurality of gratings 102. Negative first-order mode (T−1) beams propagate in the waveguide combiner 100 in a direction opposite to the $T_1$ beams. The $T_{-1}$ beams undergo TIR through the waveguide combiner 100.

Figure 2A:
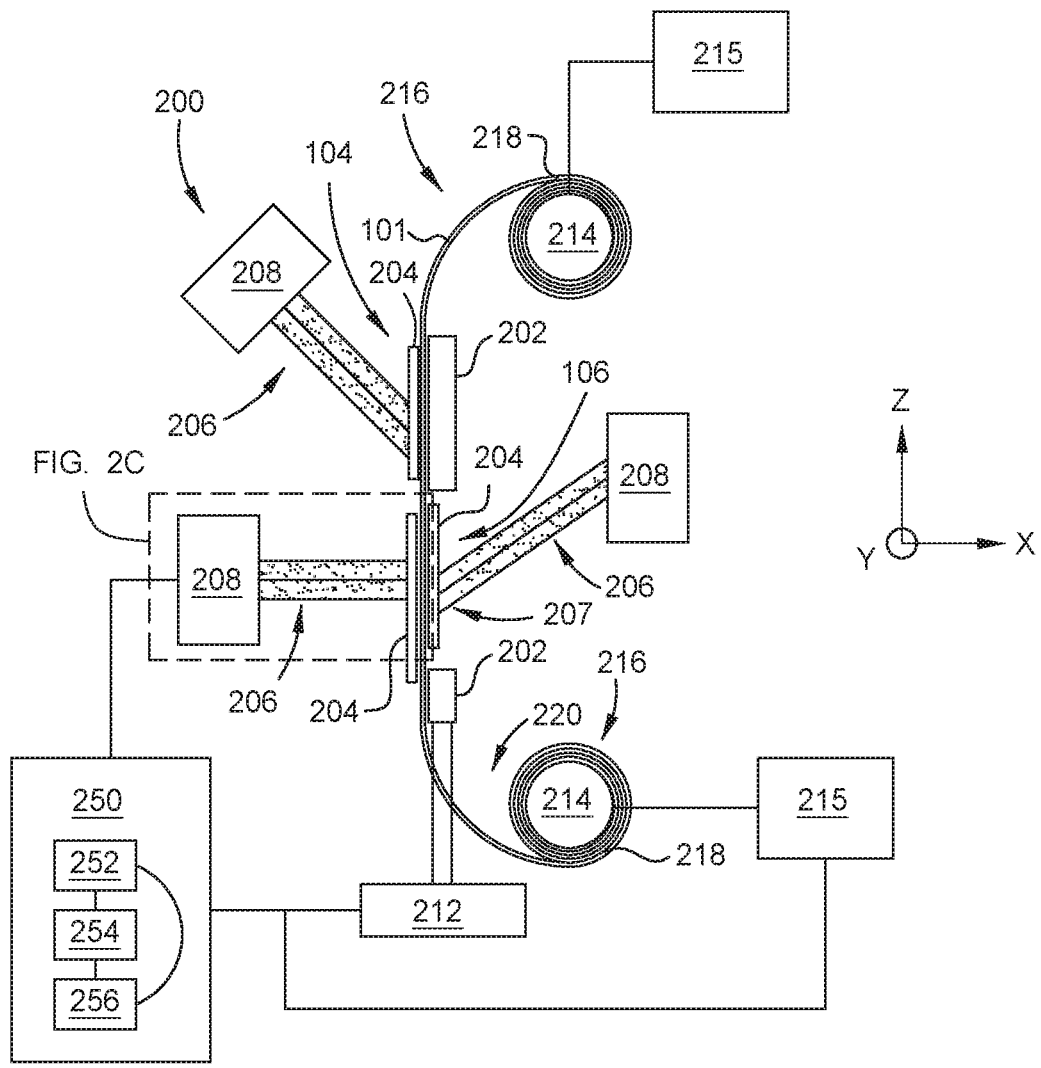
FIG. 2A is a schematic illustration of a system according to at least one embodiment described herein.
Figure 2B:
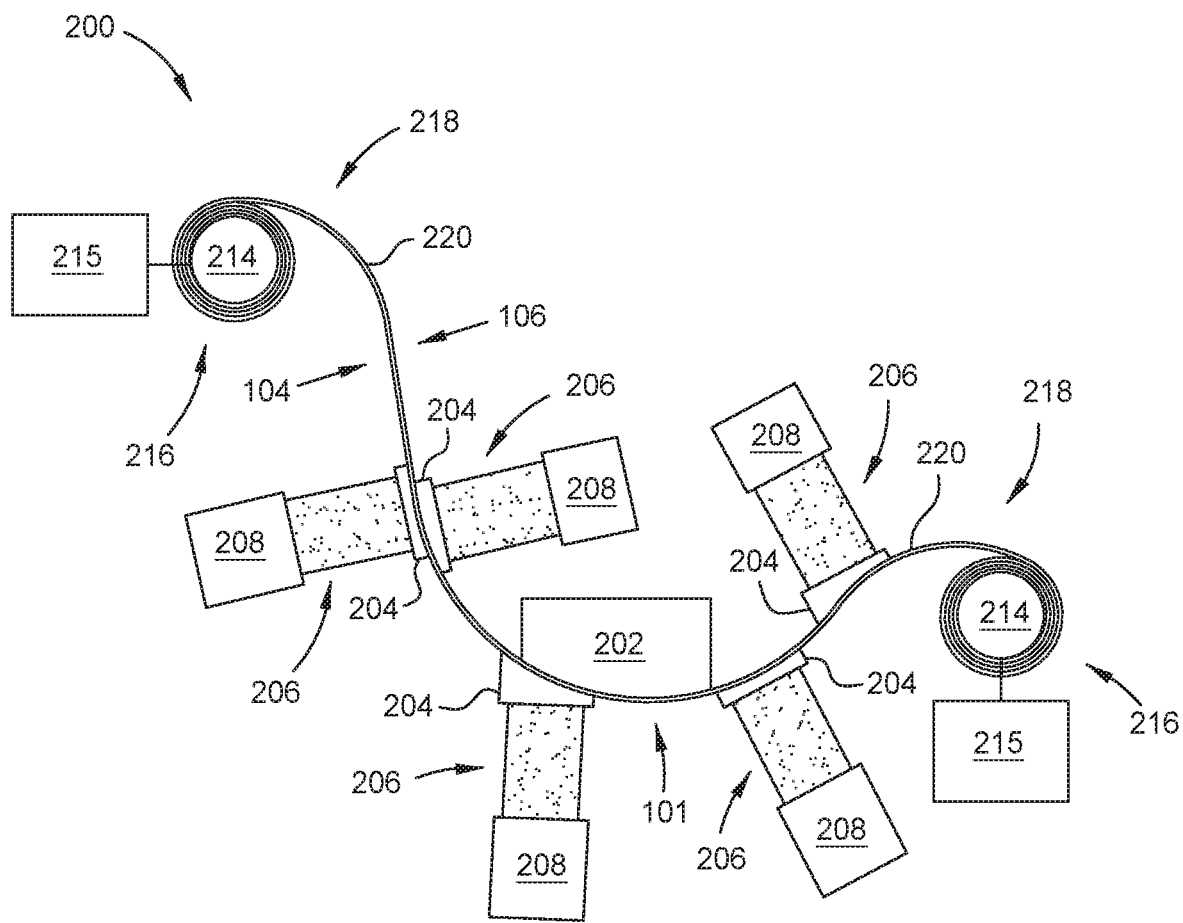
FIG. 2B is a schematic illustration of a system according to at least one embodiment described herein.

FIGS. 2A-2B illustrate a system 200 according to at least one embodiment described herein. The system 200 is configured expose ion beams 206 at different angles onto the substrate 101, which can be a flexible substrate. As shown, the system 200 includes a pedestal 202, a plurality of ion beam chambers 208, a scanner 212, and a rolling system 216.

The pedestal 202 retains the substrate 101 such that a surface 106 of the substrate 101 is exposed to ion beams 206 generated by one or more ion beam chambers 208 oriented toward the surface 106, where a device 204 may be a grating 102, for example. The pedestal 202 has one or more holes 207 to allow one or more ion beams 206 to pass therethrough and form one more devices 204 on the surface 106. Additionally, a surface 104 of the substrate 101 is exposed to the one or more ion beams 206 generated by the one or more ion beam chambers 208 oriented toward the surface 106. Both the surface 104 and the surface 106 are exposed to the one or more ion beams 206 to form devices 204 on both the surface 104 and the surface 106. As shown in FIGS. 2A-2B, the surface 104 and the surface 106 are located on opposite sides of the substrate 101. Thus, the system 200 is configured to create one or more devices 204 on both sides of the substrate 101. Additionally, the system 200 can include a scanner 212 operable to move the pedestal 202 along at least one of a y-direction and an x-direction proximate the substrate such that the one or more devices 204 can be formed on different portions of the substrate 101.

The substrate 101 has rollable and flexible properties such that the rolling system 216 is configured to portions of the substrate 101 in the path of the ion beam 206 to form the devices 204. As shown, the rolling system 216 includes a plurality of rollers 214 and a plurality of roller actuators 215. The rollers 214 rotate rolled portions 218 of the substrate 101, so that additional portions 220 of the substrate can be exposed to the one or more ion beams 206. Each of the roller actuators 215 are configured to rotate one of the plurality of rollers 214 to expose different portions of the substrate 101 to the one or more ion beams 206.

Figure 2C:
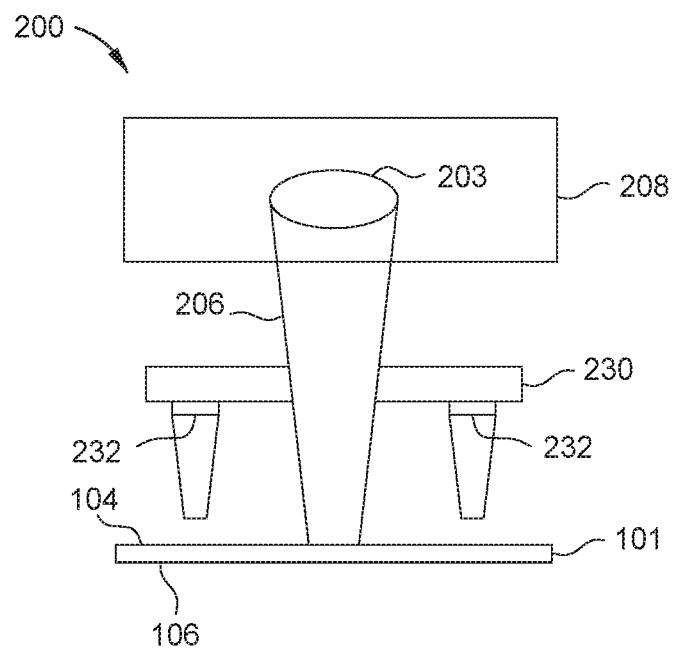
FIG. 2C illustrates a close-up schematic view of one of the ion beam chambers according to at least one embodiment described herein.

FIG. 2C illustrates a close-up schematic view of one of the ion beam chambers 208 according to at least one embodiment described herein. As shown, the ion chamber 208 includes an ion beam source 203 that is configured to generate an ion beam 206, such as a ribbon beam or a spot beam. In some embodiments, the ion beam chamber 208 is configured to direct the ion beam 206 at an optimized angle relative to the surface of the substrate 101 to form the devices 204 at different portions of the substrate 101. The angled etch system 200 also includes an extraction electrode 230 having light emitting diode (LED) arrays 232. The LED arrays 232 may be comprised of a plurality of LEDs, arranged in an array of rows and columns, such that temperature distributions may be provided on the surface 104 of the substrate 101 facing the ion beam 206 corresponding to the device 204, such as one or more of plurality of gratings 101.

The system 200 further includes a controller 250 operable to be in communication with the ion beam chambers 208, the LED arrays 205, the scanner 212, the roller actuators 215. The controller 250 is operable to control aspects of the system 200 and is configured to operate the method 300 described below. As shown, the controller 250 includes a central processing unit (CPU) 252, memory 254, and support circuits (or I/O) 256. The CPU 252 is one of any form of computer processors that are used in industrial settings for controlling various processes and hardware (e.g., pattern generators, motors, and other hardware) and monitor the processes (e.g., processing time and substrate position or location). The memory 254 is connected to the CPU 252, and is one or more of a readily available memory, such as random access memory (RAM), read only memory (ROM), floppy disk, hard disk, or any other form of digital storage, local or remote. Software instructions and data can be coded and stored within the memory 254 for instructing the CPU 252. The support circuits 254 are also connected to the CPU 252 for supporting the CPU in a conventional manner. The support circuits 254 include conventional cache, power supplies, clock circuits, input/output circuitry, subsystems, and the like.

Figure 3:
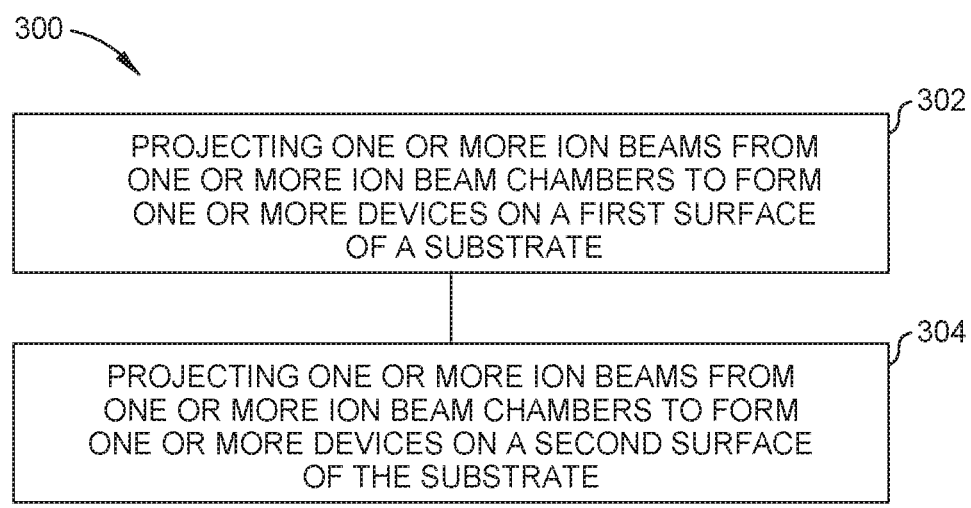
FIG. 3 is a flow chart of a method according to at least one embodiment described herein.

FIG. 3 is a flow chart of a method 300 according to at least one embodiment described herein. In these embodiments, the method 300 is performed with the systems and devices described in FIGS. 1-2C, but is not limited to these systems and devices and can be performed with other similar systems and devices.

In block 302, the one or more ion beams 206 are projected from one or more of the ion beam chambers 208 to form one or more of the devices 204 on the surface 104 of the substrate 101. Each of the one or more ion beams 206 may be directed at an optimized angle relative to the surface 104 of the substrate 101. In some embodiments, the substrate 101 is a flexible substrate such that the rolling system 216 can roll portions of the surface 104 of the substrate 101 in a path of the one or more ion beams 206.

In block 304, one or more ion beams 206 are projected from one or more ion beam chambers 208 to form one or more devices 204 on the surface 106 of the substrate 101. Each of the one or more ion beams 206 may be directed at an optimized angle relative to the surface 106 of the substrate 101. In some embodiments, the rolling system 216 can roll portions of the surface 106 of the substrate 101 in a path of the one or more ion beams 206.

In these embodiments, surface 104 and the surface 106 are on opposite sides of the substrate 101. As such, the ion beams 206 can form the devices on both sides of the substrate 101. In some embodiments, the pedestal 202 can be moved along at least one of a y-direction and an x-direction proximate the substrate 101 such that the one or more devices 204 are formed on different portions of the substrate 101. The scanner 212 can act to move the pedestal 202, however the pedestal 202 can be moved by other configurations as well.

While the foregoing is directed to implementations of the present invention, other and further implementations of the invention may be devised without departing from the basic scope thereof, and the scope thereof is determined by the claims that follow.

We claim:

1. A method for forming devices on a substrate, comprising:
projecting one or more first ion beams from one or more first ion beam chambers positioned over a first side of a rolling system, wherein each of the first ion beam chambers project the one or more first ion beams toward a first surface of a substrate, the substrate retained by a pedestal coupled to a scanner;
projecting one or more second ion beams from one or more second ion beam chambers positioned over a second side of a rolling system, wherein each of the second ion beam chambers project the one or more second ion beams toward a second surface opposite to the first surface of the substrate; and
scanning the pedestal proximate to the substrate with the scanner such that the first ion beams or the second ion beams pass through one or more holes of the pedestal.

2. The method of claim 1, wherein:
each of the one or more first ion beams are directed at a first angle relative to the first surface of the substrate by the first ion beam chambers operable to project the first ion beams at the first angle; and
each of the one or more second ion beams are directed at a second angle relative to the second surface of the substrate by the second ion beam chambers operable to project the second ion beams at the first angle.

3. The method of claim 1, wherein the substrate is a flexible substrate.

4. The method of claim 3, further comprising:
rolling portions of the substrate having the first and second surfaces in a path of the one or more first ion beams and the one or more second ion beams via the rolling system.

5. The method of claim 4, wherein the rolling system comprises a plurality of rollers and a plurality of roller actuators.

6. The method of claim 1, wherein the pedestal is scanned along at least one of a y-direction and an x-direction proximate to the substrate.

7. A system for forming devices on a substrate, comprising:
one or more first ion beam chambers positioned over a first side of a rolling system, each of the first ion beam chambers operable to project one or more first ion beams toward a first surface of a substrate, wherein at least one first ion beam chamber is operable to project a first ion beam at a first angle; and
one or more second ion beam chambers positioned over a second side of the rolling system opposite of the first side, each of the second ion beam chambers operable to project one or more second ion beams toward a second surface of the substrate, wherein the first surface and the second surface are on opposite sides of the substrate and at least one second ion beam chamber is operable to project a second ion beam at a second angle different from the first angle; and
a pedestal operable to retain the substrate, the pedestal coupled to a scanner, the pedestal having one or more holes to allow the first ion beams or the second ion beams to pass therethrough, the scanner operable to move the pedestal proximate to the substrate.

8. The system of claim 7, wherein the substrate is a flexible substrate.

9. The system of claim 7, wherein:
the rolling system is configured to roll portions of the substrate having the first and second surfaces in a path of the one or more first ion beams and the one or more second ion beams.

10. The system of claim 9, wherein the rolling system comprises a plurality of rollers and a plurality of roller actuators.

11. A system for forming devices on a substrate, comprising:
one or more first ion beam chambers positioned over a first side of a rolling system, each of the first ion beam chambers operable to project one or more first ion beams toward a first surface of a substrate;
one or more second ion beam chambers positioned over a second side of the rolling system opposite of the first side, each of the second ion beam chambers operable to project one or more second ion beams toward a second surface of a substrate, wherein the first surface and the second surface are on opposite sides of the substrate; and
a pedestal operable to retain the substrate, the pedestal coupled to a scanner, the pedestal having one or more holes to allow the first ion beams or the second ion beams to pass therethrough, the scanner operable to move the pedestal proximate to the substrate.

12. The system of claim 11, wherein at least one first ion beam chamber is operable to project a first ion beam at a first angle and at least one second ion beam chamber is operable to project a second ion beam at a second angle different from the first angle.

13. The system of claim 11, wherein the substrate is a flexible substrate.

14. The system of claim 11, wherein the rolling system is configured to roll portions of the substrate having the first and second surfaces in a path of the one or more first ion beams and the one or more second ion beams.

15. The system of claim 14, wherein the rolling system comprises a plurality of rollers and a plurality of roller actuators.

* * * * *